(12) United States Patent
Kim (10) Patent No.: US 7,457,125 B2
(45) Date of Patent: Nov. 25, 2008

(54) COOLING APPARATUS FOR FLAT DISPLAY DEVICE AND CROSS-FLOW FAN OF THE COOLING APPARATUS

(75) Inventor: Hong Ki Kim, Daegu (KR)

(73) Assignee: LG Electronics Inc., Seoul (KR)

(*) Notice: Subject to any disclaimer, the term of this patent is extended or adjusted under 35 U.S.C. 154(b) by 11 days.

(21) Appl. No.: 11/500,511

(22) Filed: Aug. 8, 2006

(65) Prior Publication Data

US 2007/0103864 A1 May 10, 2007

(30) Foreign Application Priority Data

Nov. 4, 2005 (KR) ............... 10-2005-0105176

(51) Int. Cl.
*H05K 7/20* (2006.01)
*F04D 5/00* (2006.01)

(52) U.S. Cl. ............ 361/715; 361/692; 361/695; 345/60; 345/905; 415/53.1; 454/184; 348/748

(58) Field of Classification Search ......... 361/690–695; 165/80.3, 104.33, 121–122; 415/53.1–53.3; 454/184; 345/60, 905; 348/748; 313/582
See application file for complete search history.

(56) References Cited

U.S. PATENT DOCUMENTS

| | | | | |
|---|---|---|---|---|
| 3,058,528 A | * | 10/1962 | Hiersch | 416/203 |
| 4,014,625 A | * | 3/1977 | Yamamoto | 415/53.1 |
| 4,652,101 A | * | 3/1987 | Grunwald | 353/122 |
| 4,836,743 A | | 6/1989 | Gue ou et al. | 415/53.1 |
| 6,261,051 B1 | | 7/2001 | Kolancy | 415/53.3 |
| 6,697,250 B2 | * | 2/2004 | Kuo | 361/681 |
| 6,903,928 B2 | * | 6/2005 | Lopatinsky et al. | 361/697 |
| 2004/0223299 A1 | * | 11/2004 | Ghosh | 361/687 |
| 2007/0084235 A1 | * | 4/2007 | Okazawa et al. | 62/419 |
| 2007/0212211 A1 | * | 9/2007 | Chiyoda et al. | 415/53.1 |

FOREIGN PATENT DOCUMENTS

| | | |
|---|---|---|
| AU | 467912 | 11/1975 |
| GB | 957393 | 5/1964 |

(Continued)

OTHER PUBLICATIONS

European Search Report dated Feb. 26, 2007.

*Primary Examiner*—Jayprakash N Gandhi
*Assistant Examiner*—Robert J Hoffberg
(74) *Attorney, Agent, or Firm*—Ked & Associates, LLP (57) ABSTRACT

A cooling apparatus for a flat display device includes a flat display module, a front cover for protecting a front portion of the flat display module, a back cover for protecting a rear portion of the flat display module; an air inlet formed on a portion of the back cover to allow external air to be introduced into the back cover, an air outlet formed on another portion of the back cover to allow the air introduced into the back cover to be exhausted therethrough, a cross-flow fan disposed inside the back cover and aligned with the air outlet formed on the back cover, and an air outlet channel formed in the back cover and aligned with the air outlet formed on the back cover. A ratio of an inner diameter of the cross-flow fan to an outer diameter of the cross-flow fan is 0.69±0.03.

19 Claims, 6 Drawing Sheets

FOREIGN PATENT DOCUMENTS

| | | |
|---|---|---|
| JP | 08-179836 | 7/1996 |
| JP | 10-097195 | 4/1998 |
| JP | 2001272919 A * | 10/2001 |
| JP | 2003029648 A * | 1/2003 |
| WO | WO 2005/093330 A1 | 10/2005 |

* cited by examiner

COOLING APPARATUS FOR FLAT DISPLAY DEVICE AND CROSS-FLOW FAN OF THE COOLING APPARATUS

BACKGROUND OF THE INVENTION

1. Field of the Invention

The present invention relates to a flat display device, and more particularly, to a cooling apparatus for a flat display device, which can be operated with a low noise while quickly dissipating internal heat to an external side by improving a structure of a cross-flow fan.

2. Description of the Related Art

Unlike a cathode ray tube (CRT), a flat display uses a driving circuit arranged in a matrix pattern to differently excite pixels and thus realize an image. Recently, the flat display device has been widely used as it has advantageous in that it takes up a relatively small space. A variety of flat display modules such as a liquid crystal display (LCD), a field emission display (FED), a plasma display panel (PDP), and an electro-luminescence (EL) have been applied to the flat display device.

The flat display device using the flat display module is reduced in a thickness as compared with the CRT. However, since a large number of heat-generating components must be incorporated in a narrow space of the display device, the heat, which is generated by the heat-generating components in the flat display device during the operation of the flat display module, must be effectively dissipated to an external side.

Particularly, in the case of the PDP, since the image is realized by electric discharge of discharge gas, high temperature heat is generated. Therefore, if the high temperature heat is not quickly dissipated, the display device may malfunction. Needless to say, in the case of other types of flat display devices, the heat dissipation performance is very important fact determining the quality thereof.

In order to locally dissipate the heat, a heat sink is attached on a rear surface of a specific component generating a large amount of heat to cool the specific component. Furthermore, in order to generally dissipate the heat, a plurality of holes is formed on a cover of the flat display device so that cool air can pass through the holes. However, although the cooling effect for the specific component can be expected, the heat is not effectively dissipated to the external side. Therefore, the flat display device cannot be stably operated. That is, the internal temperature of the flat display device increases to deteriorate the performance of the flat display device.

In order to solve the above problem, an axial fan is installed on a rear center of a back cover in a direction perpendicular to a direction where the display device is formed. The axial fan forcedly exhausts the internal high temperature air of the flat display device to the external side through a rear side of the display device. In this case, although the heat collected in the display device can be effectively discharged to the external side, excessive noise is generated during the operation of the axial fan. Furthermore, a gap of ten or more centimeters must be provided between the rear surface of the display device and the wall so that the air can be exhausted. In addition, due to a gap between the axial fan and the flat display module and a thickness of the axial fan, an overall thickness of the flat display device increases.

Furthermore, the noise generated from the axial fan interferes with the listening of the sound.

SUMMARY OF THE INVENTION

Accordingly, the present invention is directed to a cooling apparatus for a flat display device that substantially obviates one or more problems due to limitations and disadvantages of the related art.

An object of the present invention is to provide a cooling apparatus for a flat display device, which is designed to make the flat display device slimmer and effectively dissipate internal heat of the flat display device.

Another object of the present invention is to provide a cooling apparatus for a flat display device, which can minimize noise and be manufactured with low costs.

Still another object of the present invention is to provide a cooling apparatus that can reduce a size of the flat display device and improve heat dissipation efficiency by installing a fan on a proper location.

Still yet another object of the present invention is to provide a cooling apparatus that is proper to a flat display device that is slim, can generate air current with a low voltage and reduce the generation of the noise Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a cooling apparatus for a flat display device, including: a flat display module; a front cover for protecting a front portion of the flat display module; a back cover for protecting a rear portion of the flat display module; an air inlet formed on a portion of the back cover to allow external air to be introduced into the back cover; an air outlet formed on another portion of the back cover to allow the air introduced into the back cover to be exhausted therethrough; a cross-flow fan disposed inside the back cover and aligned with the air outlet formed on the back cover; and an air outlet channel formed in the back cover and aligned with the air outlet formed on the back cover, wherein a ratio of an inner diameter of the cross-flow fan to an outer diameter of the cross-flow fan is 0.69±0.03.

In another aspect of the present invention, there is provided a cooling apparatus for a flat display device, including: a flat display module; a front cover supporting a front portion of the flat display module; a back cover supporting a rear portion of the flat display module; an air inlet formed on the back cover to allow external air to be introduced into the back cover; an air outlet formed on the back cover to exhaust the air introduced; and a cross-flow fan disposed inside the back cover and aligned with the air outlet; and an air outlet channel formed in the back cover and aligned with the air outlet formed on the back cover, wherein a blade installation angle of the cross-flow fan is 24.2±1.5°.

In still another aspect of the present invention, there is provided a flat display device including: a flat display module; an air inlet for introducing external air into the display device; an air outlet for exhausting inner air of the display device; and a cross-flow fan disposed inside the flat display device to expel the inner air, wherein the cross-flow fan has a blade installation angle of 24.2±1.5° and a ratio of an inner diameter of the cross-flow fan to an outer diameter of the cross-flow fan of 0.69±0.03.

According to the present invention, the flat display device can be designed to be slimmer and the internal heat of the flat display device can be effectively dissipated.

Furthermore, the fan is properly designed to operate with low noise, thereby improving the user's convenience.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
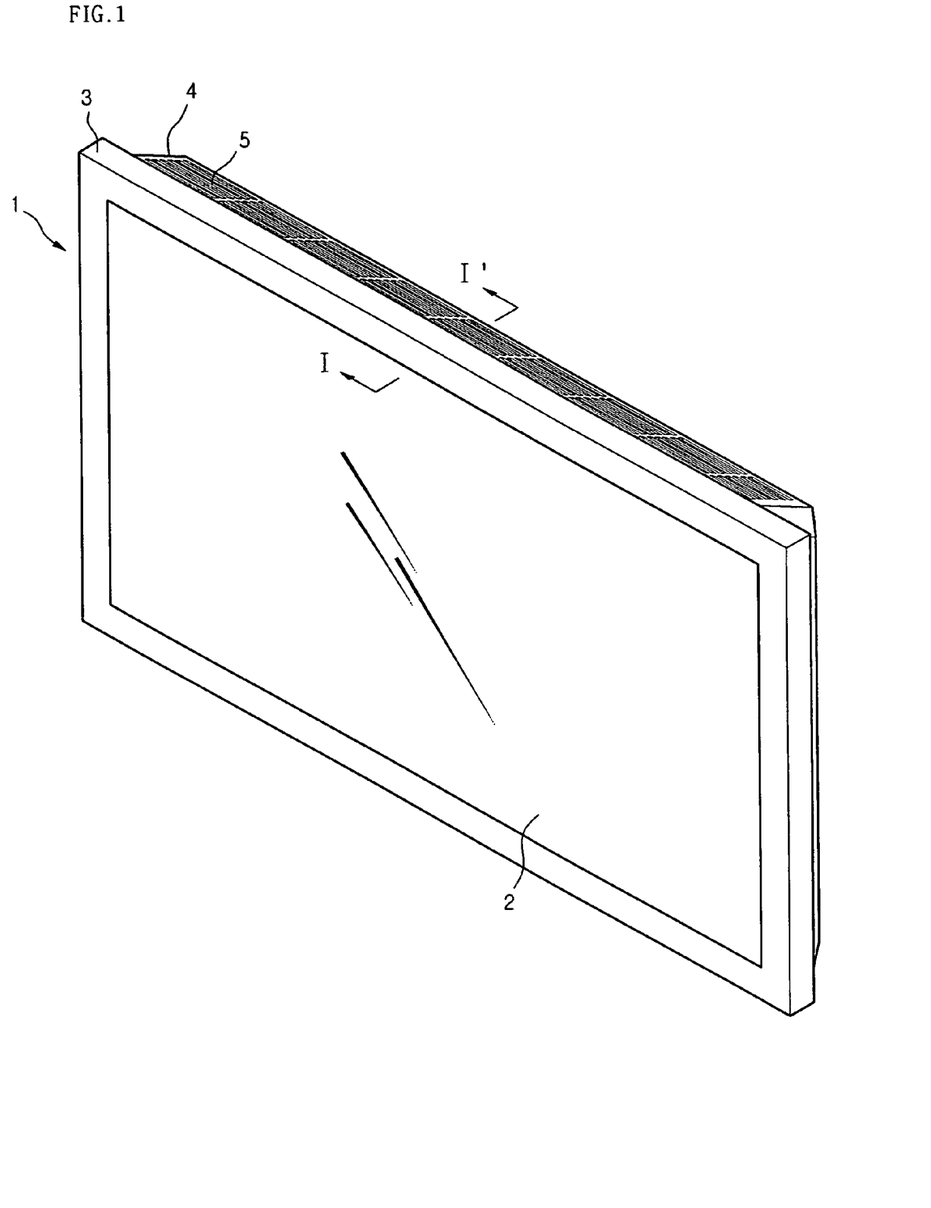
FIG. 1 is a perspective view of a flat display device having a cooling apparatus according to an embodiment of the present invention.

FIG. 1 is a perspective view of a flat display device according to an embodiment of the present invention.

Referring to FIG. 1, a flat display device 1 of this embodiment includes a flat display module 2, a front cover 3 for supporting and protecting a front portion of the flat display module 2, and a back cover 4 for supporting and protecting a rear portion of the flat display module 2. An air outlet 5 through which internal hot air of the flat display device 1 exhaust is formed on an upper peripheral of the back cover 4. The air outlet 5 has a plurality of slits.

The flat display module 2 may be selected from the group consisting of an LCD, an FED, a PDP, and an EL. Preferably, the flat display module 2 may be exemplified as the PDP generating high temperature heat.

The front and back covers 3 and 4 define a space for receiving the flat display module 2 and protect components disposed in the space. The front and back covers 3 and 4 are independent parts that are assembled with each other. However, the present invention is not limited to this case. For example, the front and rear covers 3 and 4 may be integrated with each other as a single body as far as they can protect the front and rear portions of the display device. There is a predetermined gap between a heat generating component provided on a surface of the flat display module 2 and an inner surface of the back cover 4 so that air flows through the gap to cool the heat generating component and is then exhausted through the air outlet 5.

The operation of a cooling apparatus of the present invention will now be described with reference to the above flat display device.

When the flat display device 1 operates, a large amount of heat is generated at the flat display module 2. At this point, the hot air generated from the heat generating component disposed on the rear surface of the flat display module 2 is cooled by the incoming air. Then, the hot air flows upward and is then exhausted through the air outlet 5. This is the natural convection for exhausting the hot air out of the flat display device, thereby improving the cooling efficiency. At this point, it is more preferable to allow outer air to be introduced through an overall area of the bottom peripheral portion of the flat display device 1 and exhausted via an overall area of the rear portion of the display module 2.

Furthermore, the air outlet 5 is provided on an inclined peripheral portion of the back cover 4 so that the hot air can be exhausted upward and thus the hot air can more effectively flow.

In addition, since the front surface of the flat display module 2 is exposed to the external side, the heat generated from the front portion of the display module 2 can be quickly dissipated by the natural convection of the outer air.

Figure 2:
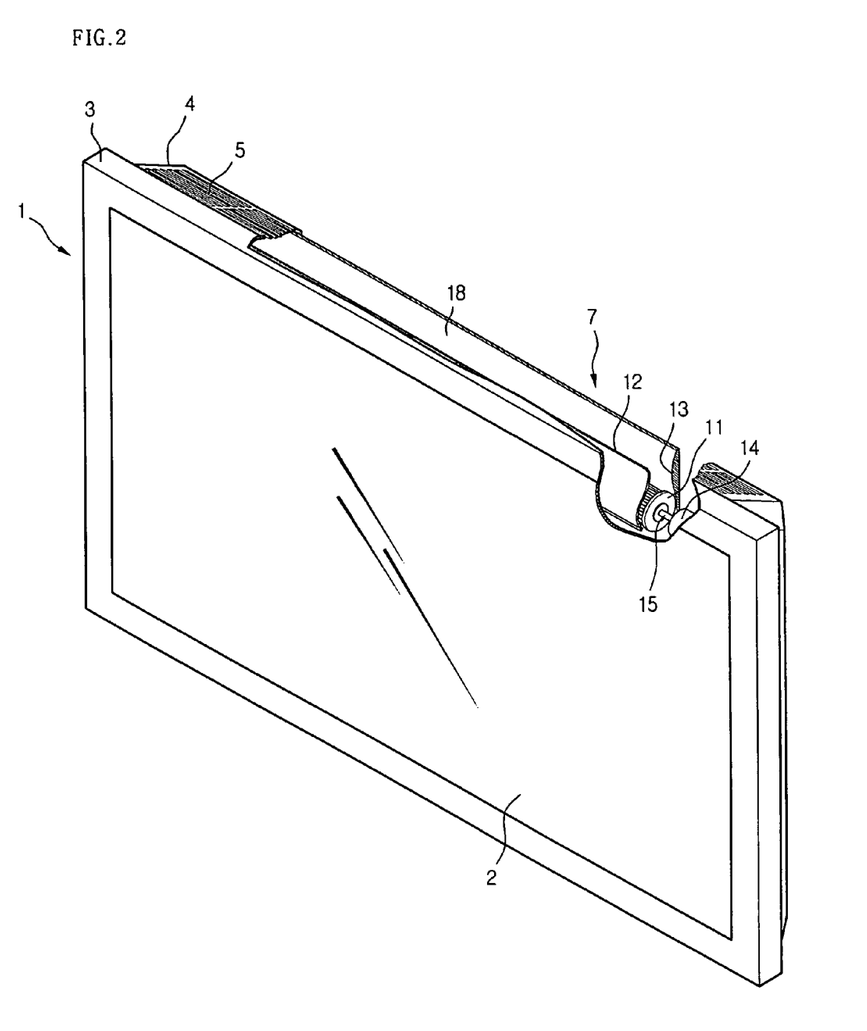
FIG. 2 is a partially broken perspective view of the flat panel display of FIG. 1.

FIG. 2 is a partially broken perspective view of the flat panel display of FIG. 1.

Referring to FIG. 2, a cross-flow fan 7 is installed in an inner-upper portion of the flat display device 1 in a longitudinal direction of the flat display device 1. The cross-flow fan provides air outlet channel aligned with the air outlet 5 so as to blow the air forced by the impeller (10 of FIG. 3).

By the cross-flow fan 7, the top surface of the back cover 4 provides a gap through which the internal hot air is exhausted to the external side. Since the hot air can be exhausted through the top surface of the back cover 4, the air exhaust can be more effectively realized to reduce airflow resistance and airflow noise, thereby enhancing the heat dissipation efficiency of the flat display device.

Describing the cross-flow fan 7 in more detail, the cross-flow fan 7 includes an impeller (10 of FIG. 3) disposed in the longitudinal direction of the back cover 4 and a circular plate 11 for dividing the impeller 10 by a predetermined interval along the longitudinal direction of the impeller 10 and enhancing strength of the impeller. The cross-flow fan 7 is further includes a driving shaft 15 connected to a motor 14. A rotational force of the motor 14 is transferred to the cross-flow fan via the driving shaft 15.

The impeller 10 is disposed in a housing 18 to guide the airflow when the impeller 10 rotates. The housing 18 includes a scroll 12 disposed in front of the impeller 10 and spaced apart from the impeller 10 and a stabilizer 13 disposed in rear of the impeller 10 and spaced apart from the impeller 10. The impeller 10 rotates clockwise in the drawing.

Figure 3:
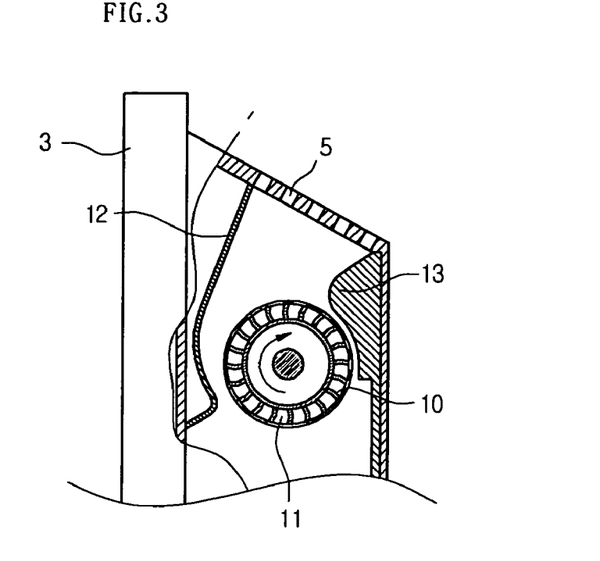
FIG. 3 is a sectional view taken along line I-I'.

FIG. 3 is a sectional view taken along line I-I'.

When the cross-flow fan 7 operates, the internal air of the back cover 4 flows upward and is then exhausted to the external side by being guided by the scroll 12.

As described above, since the cross-fan 7 extends fully relative to the overall longitudinal length of the top surface of the back cover 4, a relatively large amount of air can be exhausted. As described above, since the air exhaust area increases as compared to that of the prior art, the airflow resistance and airflow noise can be reduced. Furthermore, since the hot air is exhausted through the top surface of the back cover 4, there is no need to provide a gap between a wall on which the display device is installed and a rear surface of the back cover 4. Therefore, the flat panel display device can be closely installed on the wall, thereby taking up a relatively small space.

Meanwhile, as it is well known, a high constant pressure must be formed in a device such as an air conditioner to allow air to flow over a barrier such as a heat exchanger disturbing the airflow. However, since the flat display device has a few barriers, the air can smoothly flow even under a low constant pressure. Particularly, the fan must be operated with low noise considering the property of the display device. To reduce the noise of the fan, the inventor of this application has studied to find a condition of the cross-flow fan that can realize the low noise and high air current.

A structure of the cross-flow fan that can realize the low noise and high air current will now be described. Here, since the condition for generating high air current depends on an RPM of the cross-flow fan, the cross-flow fan will be described with reference to information obtained using an amount of noise as a major factor. The noise condition is most critical for the display device with sound system, for example television system.

Figure 4:
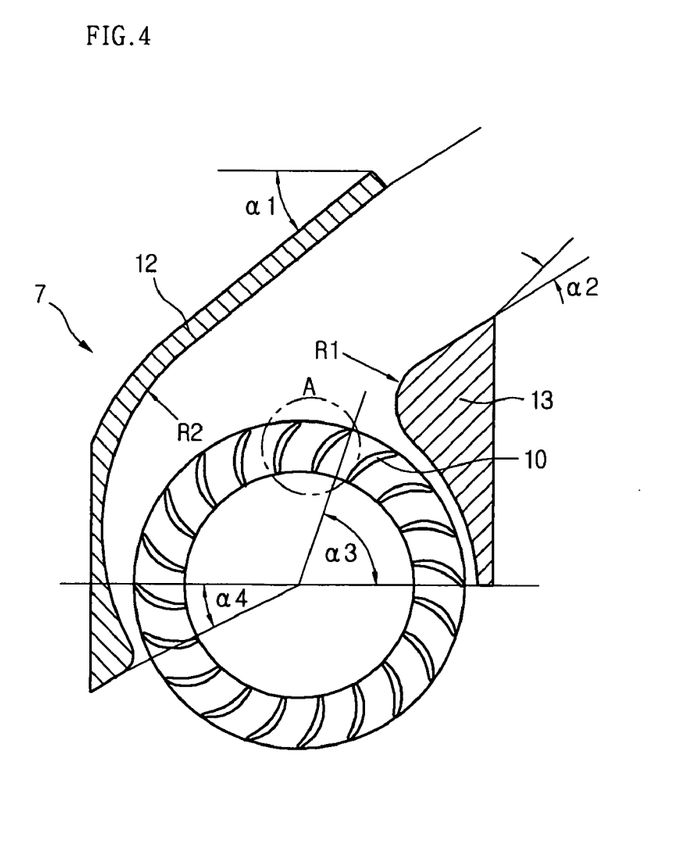
FIG. 4 is a schematic sectional view of a cross-flow fan according to an embodiment of the present invention.
Figure 5:
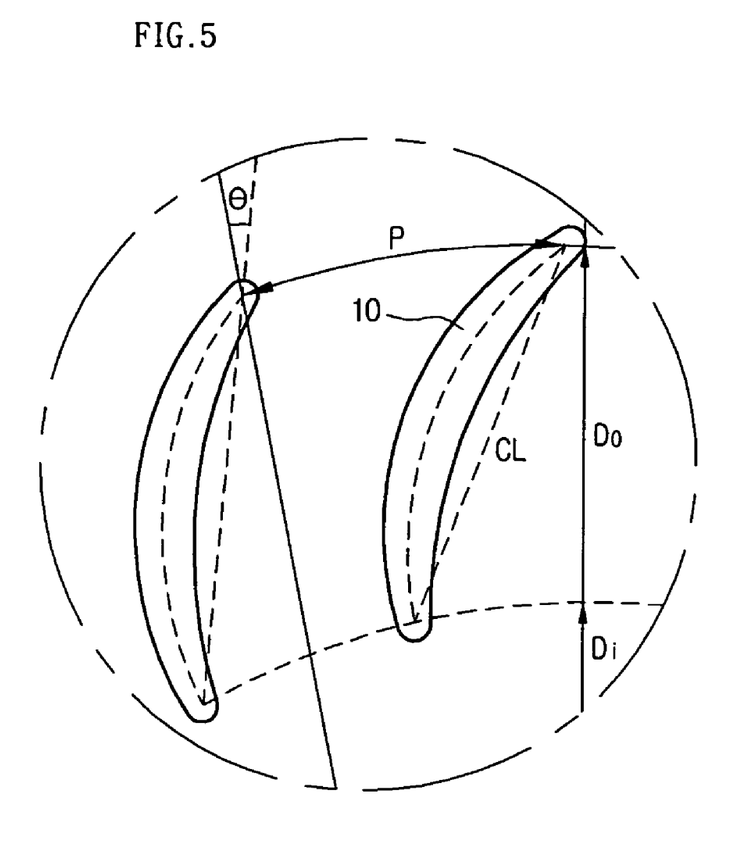
FIG. 5 is an enlarged view of a portion A of FIG. 4.

FIG. 4 is a schematic sectional view of the cross-flow fan of FIG. 3 and FIG. 5 is an enlarged view of a portion A of FIG. 4.

Referring to FIGS. 4 and 5, as described above, the cross-flow fan includes the housing 18 and the impeller 10. The housing includes the scroll 12 and the stabilizer 13.

The design factors of the cross-flow fan will now be described.

The design factors of the scroll 12, which affect on the performance of the cross-flow fan, include a scroll extreme end angle α4, a scroll radius R2, and an outlet angle α1.

The design factors of the stabilizer 13 include a stabilizer installation angle α3, a tip radius R1, and a stabilizer dispersion angle α2.

The design factors of the impeller 10 include a ratio (Di/Do) of an inner diameter Di to an outer diameter Do of a blade, a solidity, a maximum camber amount, and a blade installation angle θ.

Since a size and structure of the scroll 12 and stabilizer 13 are limited by a thickness of the flat display device other components for operating the flat display device, the shapes of the scroll 12 and stabilizer 13 are preset according to a size, structure and shape of the flat display device. Therefore, a structure of the impeller 10 is proposed when it is assumed that the shapes of the scroll 12 and stabilizer 13 are set to have the following specification.

In the scroll 12, the scroll extreme end angle α4 is 30°, the scroll radius R2 is 32 mm, and the scroll outlet angle α1 is 40°.

In the stabilizer 13, the stabilizer installation angle α3 is 80°, the tip radius R1 is 10 mm, and the stabilizer dispersion angle α2 is 10°. This specification is obtained through a plurality of tests that are performed using a 44-inch plasma display panel by the inventor of this application.

With the above specification for the scroll and stabilizer, a test for finding out the values of the design factors of the impeller 10 was preformed. The test was preformed based on 26 dB up to which the user does not feel displeasure while he/she is watching TV.

Figure 6:
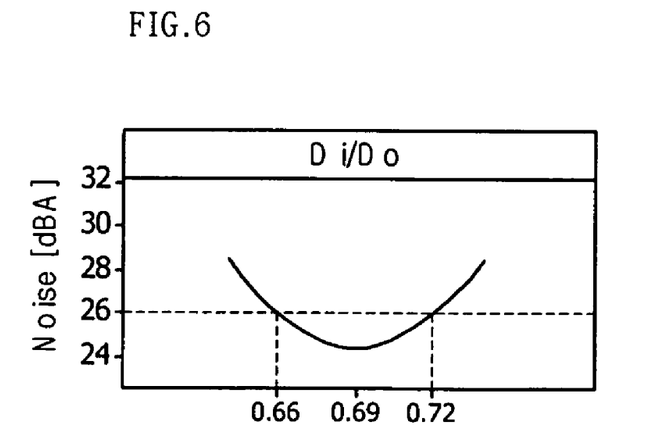
FIG. 6 is a graph illustrating an amount of noise according to a ratio between inner and outer diameters (Di/Do) of a blade of the cross-flow fan of FIG. 6.

As shown in FIG. 6, the ratio (Di/Do) increases from a lowest ratio (0.69) at both ends of a curve. Therefore, it is preferable that the ratio (Di/Do) is set to be approximately within a range of 0.69±0.03.

Figure 7:
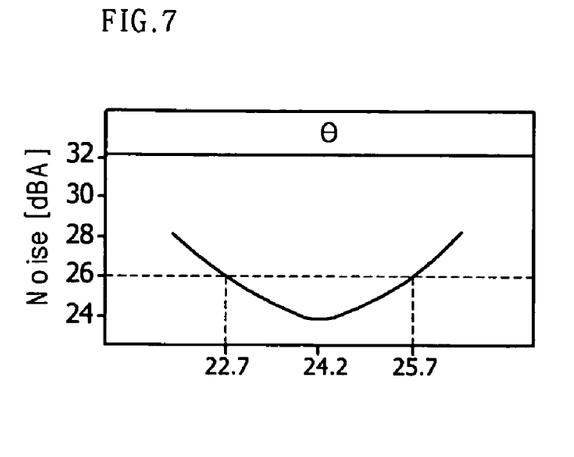
FIG. 7 is a graph illustrating an amount of noise according to an installation angle of the blade.

The blade installation angle θ is a value representing an inclination of an extending line of a chord wire of the blade. Referring to FIG. 7, when the blade installation angle θ is set at 24.2°, the lowest noise is generated. As the blade installation angle θ increases or decreases from 24.2°, the noise increases. Therefore, it is preferable that the blade installation angle θ is set to be approximately within a range of 24.2±1.5°. Furthermore, within the range of the blade installation angle θ, the number of blades is set to be within a range of 20±2.

Figure 8:
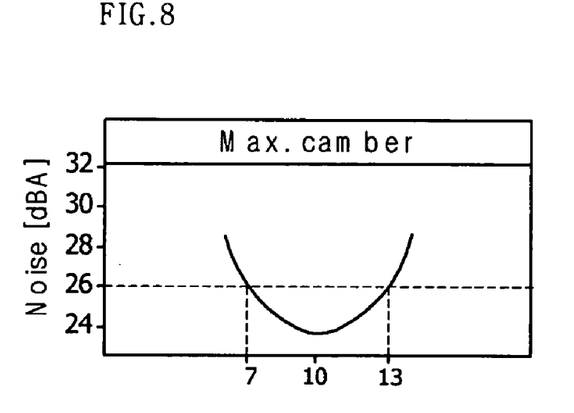
FIG. 8 is a graph illustrating an amount of noise according to a maximum amount of a camber.

The maximum camber amount is defined by a camber/chord length (CL). Referring to FIG. 8, when the maximum camber amount is 10%, the lowest noise is generated. The noise increases as the maximum camber amount increases and decreases from 10%. Therefore, it is preferable that the maximum camber amount is set to be approximately within a range of 10±3%.

Figure 9:
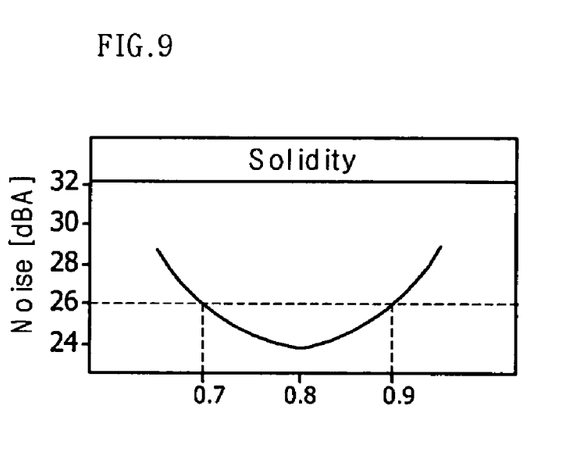
FIG. 9 is a graph illustrating an amount of noise according to a solidity.

The solidity is a value (Chord Length(CL)/Pitch(P)). Referring to FIG. 9, when the solidity is 0.8, the lowest noise is generated. As the solidity increases or decreases from 0.8, the noise increases. Therefore, it is preferable that the solidity is set to be approximately within a range of 0.8±0.1.

When the value is located at a center in the range of each design factor of the impeller 10, the minimum noise is generated.

In addition, since the ratio of the inner diameter to the outer diameter of the blade and the blade installation angle directly affect on the noise generation, these design factors must be maintained at the proper values.

The operation of the cooling apparatus for the flat display device according to the present invention will now be described.

Figure 10:
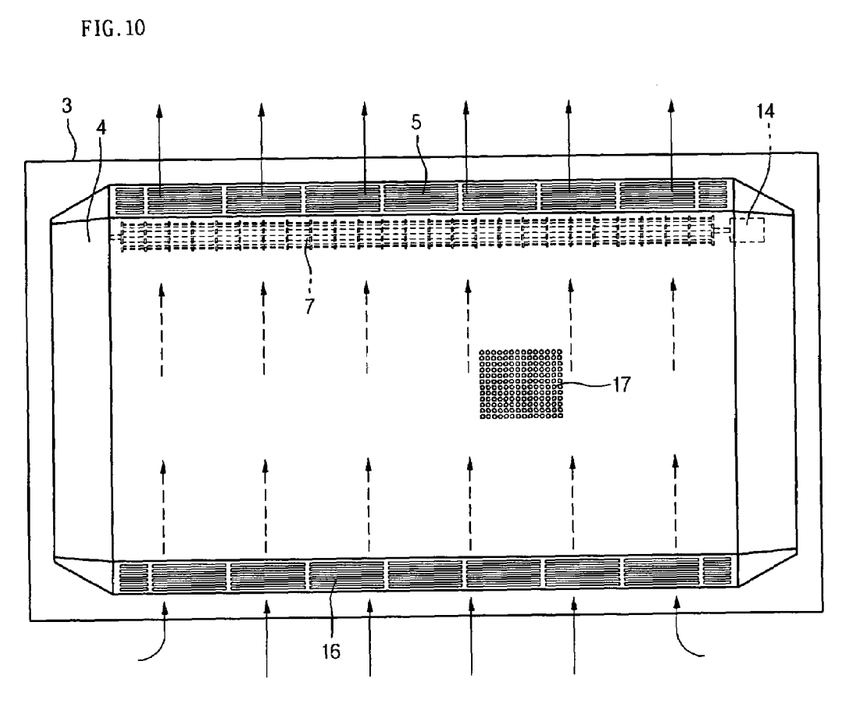
FIG. 10 is a rear view of the flat display device of FIG. 1.

FIG. 10 is a rear view of the flat display device of FIG. 1.

Referring to FIG. 10, in addition to the upper air outlet, a side air inlet 16 and a rear air inlet 17 are further formed on the back cover 4.

The lower air inlet 16 is formed on an inclined portion of the lower peripheral of the back cover 4 to introduce external cool air into the flat display device. The cool air introduced through the lower air inlet compensates for the hot air exhausted through the air outlet 5. That is, the cool air introduced compensates for a negative pressure generated by the natural convection and a negative pressure generated by the air exhausted through the air outlet 5.

The cool air introduced through the lower air inlet 16 cools the components provided on the rear surface of the flat display module 2 and is then exhausted through the air outlet 5 via the cross-flow fan 7.

The lower air inlet 16 is preferably formed along the overall longitudinal length of the lower peripheral of the back cover 4 so that the components can be uniformly cooled. Arrows in the drawing indicates the airflow direction.

The cross-flow fan 7 is formed along the overall longitudinal length of the upper peripheral of the back cover 4 and the effective exhaust area is formed throughout the overall area of the upper surface of the back cover 4. Therefore, the cool air introduced through the lower air inlet 16 flows upward, in the course of which the components is cooled, and is then exhausted through the air outlet 5. If the length of the cross-flow fan 7 is reduced, the heat dissipation effect at the both inner sides of the flat display device may be reduced. Nevertheless, since the effective exhaust area is large enough, the heat dissipation efficiency can be still improved.

Some of the components (i.e., a power unit) generate high temperature heat and some of the components (i.e., tape carrier package chip (TCP)) require a low temperature condition.

In order to meet the operational condition for each component, it is preferable that the components that require the thermal stability are disposed close to the lower air inlet 16 so that they can be quickly cooled by the cool air introduced. In addition, the components generating a large amount of heat is preferably disposed close to the cross-flow fan 7 so that the heat generated by the components can be quickly dissipated without affecting on other circuits.

The rear air inlet 17 is provided for the components that cannot be changed their installing location. In other words, the rear air inlet 17 is formed on a portion of the back cover 4 corresponding to a specific portion of the flat display module 2 where the heat generation components are disposed. Therefore, the heat generation components disposed corresponding to the rear air inlet 17 can be quickly cooled by the cool air introduced through the rear air inlet 17. If the installing location of the heat generation components can be changed, the rear air intake opening components may be omitted. That is, the heat generation components may be adjusted in their installing location to be closer to the cross-flow fan 7 or the lower air inlet 16.

As described above, since the cross-flow fan can be disposed long along the one of the side periphery of the back cover 4, the internal hot air of the back cover can be quickly exhausted, thereby improving the heat dissipation efficiency and operational reliability of the flat display device.

According to the present invention, since no space for installing the blower fan is required, the flat display device can be designed to be slimmer while providing a sufficient heat dissipation effect.

In addition, since there is no need to make air inlet and outlet holes separately on the back cover because of high air speed in the display device, the strength of the back cover is not deteriorated. Therefore, there is no need to make the back cover using a high strength steel plate, thereby reducing the manufacturing cost.

Since the installation location of the fan is properly set, the structure is simplified and thus a size of the flat display device can be reduced.

Since the structure of the cross-flow fan is optimized, the fan can operate with low noise and high air current. As a result, the user does not feel displeasure while he/she is watching TV.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A cooling apparatus for a flat display device, comprising:
   a flat display module;
   a front cover for protecting a front portion of the flat display module;
   a back cover for protecting a rear portion of the flat display module;
   an air inlet formed on a portion of the back cover to allow external air to be introduced into the back cover;
   an air outlet formed on another portion of the back cover to allow the air introduced into the back cover to be exhausted therethrough;
   a cross-flow fan disposed inside the back cover and aligned with the air outlet formed on the back cover; and
   an air outlet channel formed in the cross-flow fan, aligned with the air outlet of the back cover,
   wherein a ratio of an inner diameter of the cross-flow fan to an outer diameter of the cross-flow fan is 0.69±0.03, and a blade installation angle of the cross-flow fan is 24.2±1.5°.

2. The cooling apparatus according to claim 1, wherein the cross-flow fan has a scroll extreme end angle of 30°, a scroll radius of 32 mm, a scroll outlet angle of 40°, a stabilizer installation angle of 80°, a tip radius of 10 mm, and a stabilizer dispersion angle of 10°.

3. The cooling apparatus according to claim 1, wherein a maximum camber amount of a blade of the cross-flow fan is 10±3%.

4. The cooling apparatus according to claim 1, wherein a solidity of a blade of the cross-flow fan is 0.8±0.1.

5. The cooling apparatus according to claim 1, wherein the number of blades of the cross-flow fan is 20±2.

6. The cooling apparatus according to claim 1, wherein the cross-flow fan rotates clockwise when it is viewed from a right side of the flat display device.

7. The cooling apparatus according to claim 1, wherein the air outlet of the back cover is formed on an upper peripheral portion of the back cover.

8. The cooling apparatus according to claim 1, wherein the air inlet of the back cover is formed on a lower peripheral portion of the back cover.

9. A cooling apparatus for a flat display device, comprising:
   a flat display module;
   a front cover supporting a front portion of the flat display module;
   a back cover supporting a rear portion of the flat display module;
   an air inlet formed on the back cover to allow external air to be introduced into the back cover;
   an air outlet formed on the back cover to exhaust the air introduced; and
   a cross-flow fan disposed inside the back cover and aligned with the air outlet; and
   an air outlet channel of the cross-flow fan aligned with the air outlet formed on the back cover,
   wherein a blade installation angle of the cross-flow fan is 24.2±1.5°.

10. The cooling apparatus according to claim 9, wherein the cross-flow fan has a scroll extreme end angle of 30°, a scroll radius of 32 mm, a scroll outlet angle of 40°, a stabilizer installation angle of 80°, a tip radius of 10 mm, and a stabilizer dispersion angle of 10°.

11. The cooling apparatus according to claim 9, wherein a maximum camber amount of a blade of the cross-flow fan is 10±3%.

12. The cooling apparatus according to claim 9, wherein a solidity of a blade of the cross-flow fan is 0.8±0.1.

13. The cooling apparatus according to claim 9, wherein the number of blades of the cross-flow fan is 20±2.

14. The cooling apparatus according to claim 9, wherein the cross-flow fan rotates clockwise when it is viewed from a right side of the flat display device.

15. The cooling apparatus according to claim 9, wherein the air outlet of the back cover is formed on an upper peripheral portion of the back cover.

16. The cooling apparatus according to claim 9, wherein the air inlet of the back cover is formed on a lower peripheral portion of the back cover.

17. A flat display device comprising:
a flat display module;
an air inlet for introducing external air into the display device;
an air outlet for exhausting inner air of the display device; and
a cross-flow fan disposed inside the flat display device to expel the inner air,
wherein the cross-flow fan has a blade installation angle of 24.2±1.5° and a ratio of an inner diameter of the cross-flow fan to an outer diameter of the cross-flow fan of 0.69±0.03.

18. The flat display device according to claim 17, wherein a maximum camber amount of a blade of the cross-flow fan is 10±3%.

19. The cooling apparatus according to claim 17, wherein a solidity of a blade of the cross-flow fan is 0.8±0.1.

* * * * *